(12) United States Patent
Kawasaki

(10) Patent No.: US 7,907,924 B2
(45) Date of Patent: Mar. 15, 2011

(54) SEMICONDUCTOR DEVICE INTERCONNECTING UNIT, SEMICONDUCTOR DEVICE AND HIGH-FREQUENCY MODULE HAVING A MILLIMETER WAVE BAND

(75) Inventor: Kenichi Kawasaki, Fukushima (JP)

(73) Assignee: Sony Corporation, Tokyo (JP)

( * ) Notice: Subject to any disclaimer, the term of this patent is extended or adjusted under 35 U.S.C. 154(b) by 583 days.

(21) Appl. No.: 11/750,855

(22) Filed: May 18, 2007

(65) Prior Publication Data

US 2007/0285187 A1 Dec. 13, 2007

(30) Foreign Application Priority Data

May 19, 2006 (JP) .................. 2006-140597

(51) Int. Cl.
*H04B 1/06* (2006.01)

(52) U.S. Cl. ..... 455/252.1; 455/76; 455/333; 455/114.1; 455/339; 455/424; 455/456.5; 455/63.1; 455/278.1; 455/575.1; 455/561; 455/296; 455/306; 455/289; 455/291; 455/302; 333/32; 333/175; 333/12; 333/185; 333/181; 333/183; 333/204; 333/223; 336/200; 336/83; 336/192; 336/206; 336/232; 327/551; 327/558

(58) Field of Classification Search .................. 455/76, 455/333, 307, 114.1, 339, 424, 456.5, 63.1, 455/550.5, 561, 278.1, 296, 306, 289, 291, 455/302, 252.1, 575.1; 324/322, 175; 257/754; 333/32, 175, 185, 181, 12, 183, 204; 327/551, 327/558

See application file for complete search history.

(56) References Cited

U.S. PATENT DOCUMENTS

| 5,057,778 | A | 10/1991 | Rath |
| 5,166,621 | A * | 11/1992 | Codrington et al. .......... 324/322 |
| 5,202,656 | A | 4/1993 | Clark et al. |
| 5,697,087 | A | 12/1997 | Miya et al. |
| 6,646,520 | B2 * | 11/2003 | Miller ............................. 333/32 |
| 7,327,035 | B2 * | 2/2008 | Barton et al. ................. 257/754 |
| 7,418,251 | B2 * | 8/2008 | Liu ............................... 455/333 |
| 2003/0209784 | A1 | 11/2003 | Schmitz et al. |
| 2005/0245102 | A1 | 11/2005 | Cave et al. |

FOREIGN PATENT DOCUMENTS

| JP | 10-190307 | 7/1998 |
| JP | 11-274369 | 10/1999 |
| JP | 2003-283286 | 10/2003 |
| JP | 2005-524995 | 8/2005 |
| JP | 2006-74257 | 3/2006 |
| JP | 2006-074257 | 3/2006 |
| JP | 2007-31221 | 11/2007 |

* cited by examiner

Primary Examiner — Matthew D Anderson
Assistant Examiner — April G Gonzales
(74) Attorney, Agent, or Firm — K&L Gates LLP

(57) ABSTRACT

A semiconductor device interconnecting unit configured to input/output a high-frequency signal having a millimeter wave band to/from a semiconductor device is provided. The semiconductor or device interconnecting unit includes a part of a band pass filter configured to pass therethrough the high-frequency signal having a millimeter wave band by using an LC resonance circuit, and a remainder of the band pass filter, wherein the part and the remainder are separated from each other. The part is provided inside the semiconductor device, and the remainder is provided outside the semiconductor device. The part and the remainder include capacitors having variable capacitors added thereto, respectively. A pass band for the high-frequency signal having a millimeter wave band is changed by changing capacitance values of the variable capacitors.

3 Claims, 14 Drawing Sheets

SEMICONDUCTOR DEVICE INTERCONNECTING UNIT, SEMICONDUCTOR DEVICE AND HIGH-FREQUENCY MODULE HAVING A MILLIMETER WAVE BAND

CROSS REFERENCE TO RELATED APPLICATIONS

The present application claims priority to Japanese Patent Application JP 2006-140597 filed in the Japan Patent Office on May 19, 2006, the entire contents of which being incorporated herein by reference.

BACKGROUND

The present disclosure relates to a semiconductor device interconnecting unit for inputting/outputting a high-frequency signal to/from a semiconductor device. Also, the disclosure relates to a semiconductor device which is interconnected to another device by the semiconductor device interconnecting unit. Also, the invention relates to a high-frequency module in which semiconductor devices interconnected to each other by the semiconductor device interconnecting unit are installed together with other devices.

Japanese Patent Laid-open No. 2006-74257 discloses a high-frequency band pass filter and a cable connector unit with a built-in filter. Here, the high-frequency band pass filter filters an interfering wave or the like with which a received broadcasting wave is mixed. Also, the cable connector unit with a built-in filter is structured by using the high-frequency band pass filter and is used in the form of intermediate one which is inserted into a cable of a broadcasting receiver.

In recent years, a digital camera has come to have a resolution corresponding to five millions or more pixels with the advance of the technology relating to an image pickup device using a CCD, a CMOS and the like. An increase in precision of an image increases with the improvement in the resolution results in an amount of image data increases. For this reason, it is necessary to increase a speed of a data communication between the image pickup device and a signal processing circuit for subjecting an image signal corresponding to an image captured with the image pickup device to image signal processing. In addition, in a liquid crystal TV as well, a high speed promotion for a data communication has similarly become a problem.

For the high speed promotion for the data communication, for example, the transmission of a high-frequency signal having a frequency band, of 10 to 100 GHz, sufficiently exceeding 1 GHz needs to be taken into consideration. The frequency band of the high-frequency signal belongs to a band called a millimeter wave band, and the high-frequency signal concerned is applied to communication apparatuses, antenna devices, RF sensors and the like.

Heretofore, a bonding technique or a flip flop technique has been utilized in interconnection between semiconductor chips.

FIG. 17 shows a state in which a semiconductor chip 1 and an external circuit 2 are interconnected to each other through a bonding wire 4. One terminal of the bonding wire 4 is connected to a bonding pad 3 formed on a surface of the semiconductor chip 1, and the other terminal thereof is connected to a bonding pad 5 formed on a surface of the external circuit 2.

However, in the interconnection between the semiconductor chip 1 and the external circuit 2 shown in FIG. 17, an increase in frequency makes it difficult to perform the interconnection between them because of the dispersion of capacities of the bonding pads 3 and 5, and the dispersion of lengths of the bonding wire 4.

In addition, as has been described, it is not easy to realize a high-frequency switch having excellent isolation by utilizing a CMOS technique which has recently attracted in the field of an image pickup device in a digital camera. It is therefore desirable to provide a high-frequency switch having excellent isolation.

SUMMARY

According to an embodiment, there is provided a semiconductor device interconnecting unit for inputting/outputting a high-frequency signal having a millimeter wave band to/from a semiconductor device, including: a part of a band pass filter for passing therethrough the high-frequency signal having a millimeter wave band by using an LC resonance circuit; and a remainder of the band pass filter; in which the part and the remainder are separated from each other, the part is provided inside the semiconductor device, and the remainder is provided outside the semiconductor device; and the part and the remainder include capacitors having variable capacitors added thereto, respectively, and a pass band for the high-frequency signal having a millimeter wave band is changed by changing capacitance values of the variable capacitors.

The pass band for the high-frequency signal having a millimeter wave band is changed by changing the capacitance values of the variable capacitors added to the capacitors of the part and the remainder of the band pass filter, respectively. As a result, the semiconductor device interconnecting unit according to the embodiment functions as a high-frequency switch.

According to another embodiment, there is provided a semiconductor device with a high-frequency signal having a millimeter wave band being inputted/outputted to/from the semiconductor device, the semiconductor device including: a part of a band pass filter for passing therethrough the high-frequency signal having a millimeter wave band by using an LC resonance circuit; in which the part of the band pass filter is connected to a remainder of the band pass filter provided outside the semiconductor device; and the part and the remainder include capacitors having variable capacitors added thereto, respectively, and a pass band for the high-frequency signal is changed by changing capacitance values of the variable capacitors.

According to an embodiment, there is provided a high-frequency module with a semiconductor device to/from which a high-frequency signal having a millimeter wave band is inputted/outputted being installed together with other elements or devices in the high-frequency module, in which the semiconductor device includes a part of a band pass filter for passing therethrough the high-frequency signal having a millimeter wave band by using an LC resonance circuit; a part of the band pass filter is connected to a remainder of the band pass filter provided outside the semiconductor device; and the part and the remainder include capacitors having variable capacitors added thereto, respectively, and a pass band for the high-frequency signal is changed by changing capacitance values of the variable capacitors.

The embodiment adopts such a band pass variable filter input/output structure that a central frequency of the band pass filter is shifted by making the capacitance values of the variable capacitors variable in accordance with such utilization that a signal having a full band containing a D.C. component needs not to be passed in the connection for the high-frequency signal, and a variable capacitor can be made on a semiconductor substrate. In the embodiment, a pad on an integrated circuit is utilized as the part of the band pass variable filter structure. The variable capacitors are added to the capacitors of the band pass filter circuit, respectively. The frequency pass band is controlled by changing the capacitance values of the variable capacitors. As a result, the semiconductor device interconnecting unit functions as a switch for selecting a desired signal from the signal obtained through the frequency multiplexing operation. In addition, controlling the capacitances of the variable capacitors makes it possible to compensate for the dispersion of the characteristics caused by the dispersion of the manufacturing processes, and the environmental change.

In addition, the damage which is incurred on the circuit by electrostatic discharge (ESD) from the outside can be reduced by limiting the frequency band.

According to the embodiments, it is possible to provide the high-frequency switch having the excellent isolation. In addition, controlling the capacitance values of the variable capacitors makes it possible to compensate for the dispersion of the characteristics caused by the dispersion of the manufacturing processes, and the environmental change.

Additional features and advantages are described herein, and will be apparent from, the following Detailed Description and the figures.

DETAILED DESCRIPTION

Figure 1:
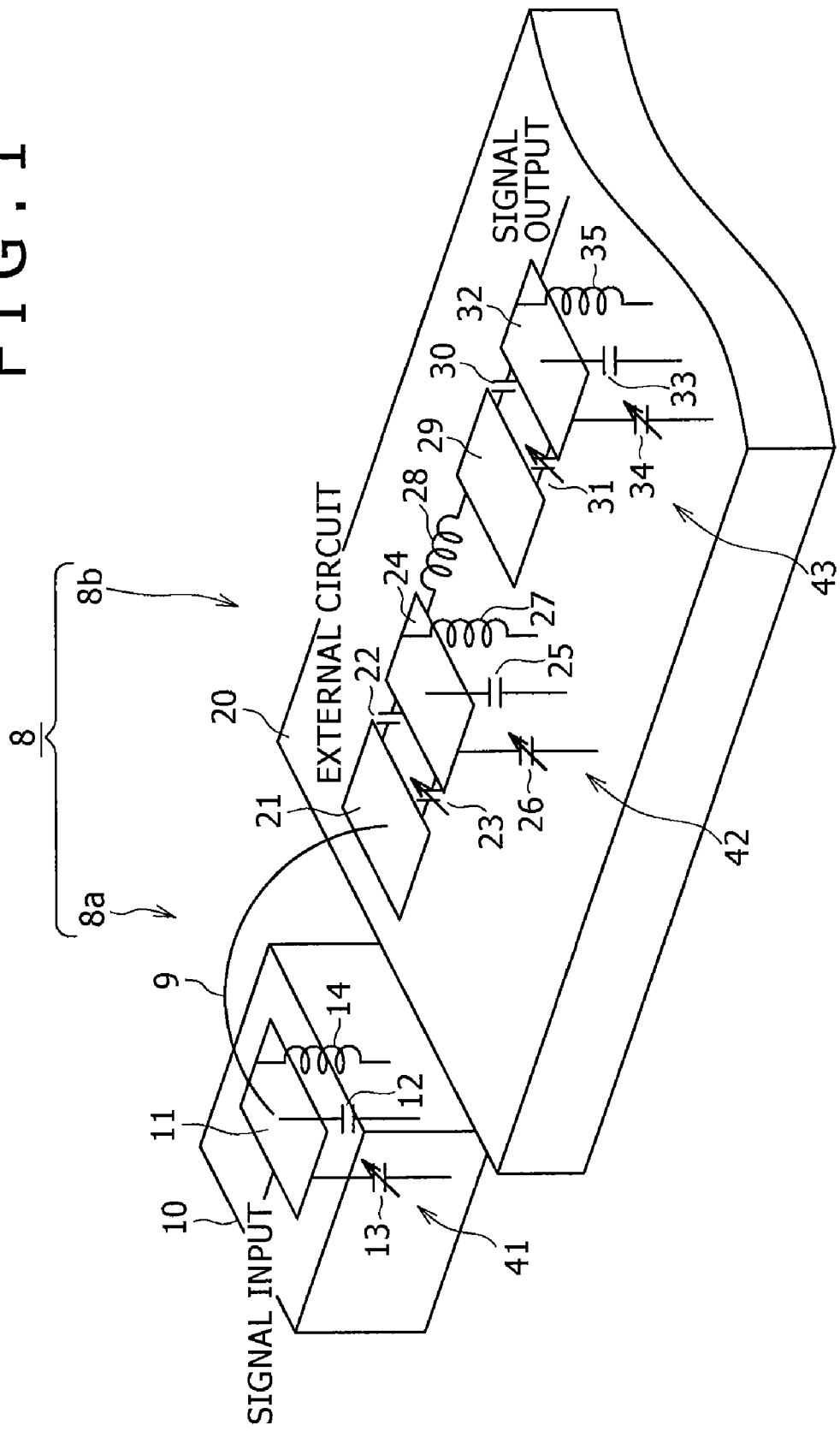
FIG. 1 is a schematic perspective view partly in circuit structure of a semiconductor device interconnecting unit according to an embodiment.

Embodiments are described in detail hereinafter with reference to the accompanying drawings. FIG. 1 is a schematic perspective view partly in circuit structure of a semiconductor device interconnecting unit 8 according to an embodiment. With the semiconductor device interconnecting unit 8, a bonding pad 11 formed on a surface of a semiconductor device 10, and a bonding pad 21 formed on a surface of an external circuit 20 are connected to each other through a bonding wire 9. Also, a high-frequency signal having a millimeter wave band is transmitted between the semiconductor device 10 and the external circuit 20. In particular, the structure shown in FIG. 1 is such that the high-frequency signal having a millimeter wave band inputted to the semiconductor device 10 is transmitted to the external circuit 20 through the semiconductor device interconnecting unit 8, and is outputted from the external circuit 20.

Thus, the semiconductor device interconnecting unit 8 includes a part 8a of a band pass filter, and a remainder 8b of the band pass filter. Here, the part 8a of the band pass filter passes therethrough the high-frequency signal having a millimeter wave band by using an LC resonance circuit. The part 8a and the remainder 8b of the band pass filter are separated from each other. Thus, the part 8a of the band pass filter is provided inside the semiconductor device 10, and the remainder 8b thereof is provided outside the semiconductor device 10 (that is, inside the external circuit 20). Moreover, as described later, the part 18a and the remainder 8b of the band pass filter include capacitors having variable capacitors added thereto, respectively. A pass band for the high-frequency signal is changed by changing capacitance values of the variable capacitors.

Referring now to FIG. 1, in the inside of the semiconductor device 10, a fixed capacitor 12, a variable capacitor 13, and a fixed inductor 14 which constitute an LC resonance circuit 41 are connected to the bonding pad 11, and are formed in a depth direction of the semiconductor device 10. Here, the fixed capacitor 12, the variable capacitor 13, and the fixed inductor 14 form the part 8a of the band pass filter. Note that, the band pass filter (BPF) structured as shown in FIG. 1 is one having n=5. The number of stages of the BPF is suitably selected in accordance with a request for frequency characteristics.

In addition, in the external circuit 20, a fixed capacitor 22, and a variable capacitor 23 which constitute the remainder 8b of the band pass filter are connected to the bonding pad 21, and is also connected to a connection portion 24 provided on the surface of the external circuit 20. In addition, a fixed capacitor 25, a variable capacitor 26, and a fixed inductor 27 which constitute an LC resonance circuit 42 are connected to the connection portion 24. Also, a fixed inductor 28 provided on the surface of the external circuit 20 is connected to the connection portion 24. The fixed inductor 28 is connected to a connection portion 29 provided on the surface of the external circuit 20. A fixed capacitor 30 and a variable capacitor 31 are connected to the connection portion 29. The fixed capacitor 30 and the variable capacitor 31 are also connected to a connection portion 32 formed on the surface of the external circuit 20. A fixed capacitor 33, a variable capacitor 34, and a fixed inductor 35 which constitute an LC resonance circuit 43 are connected to the connection portion 32. Also, the signal is outputted from the connection portion 32.

The structure shown in FIG. 1 is a band pass variable filter input/output structure that a central frequency of the band pass filter is shifted by making the capacitance values of the variable capacitors variable in accordance with such utilization that a signal having a full band containing a D.C. component needs not to be passed in the connection for the high-frequency signal, and a variable capacitor can be made on a semiconductor substrate.

In this embodiment, the bonding pad 11 formed on the semiconductor device 10 is utilized as a part of the band pass variable filter input/output structure. As described above, the variable capacitors 13, 23, 26, 31 and 34 are added to the fixed capacitors 12, 22, 25, 30 and 33 of the band pass filter (band pass filter structure), respectively. The frequency pass band is controlled by changing the capacitance values of the variable capacitors 13, 23, 26, 31 and 34. As a result, the semiconductor device interconnecting unit 8 functions as a switch for selecting a desired signal from the signal obtained through the frequency multiplexing operation. In addition, controlling the capacitance values of the variable capacitors 13, 23, 26, 31 and 34 makes it possible to compensate for the dispersion of the characteristics caused by the dispersion of the manufacturing processes, and the environmental change.

Figure 2:
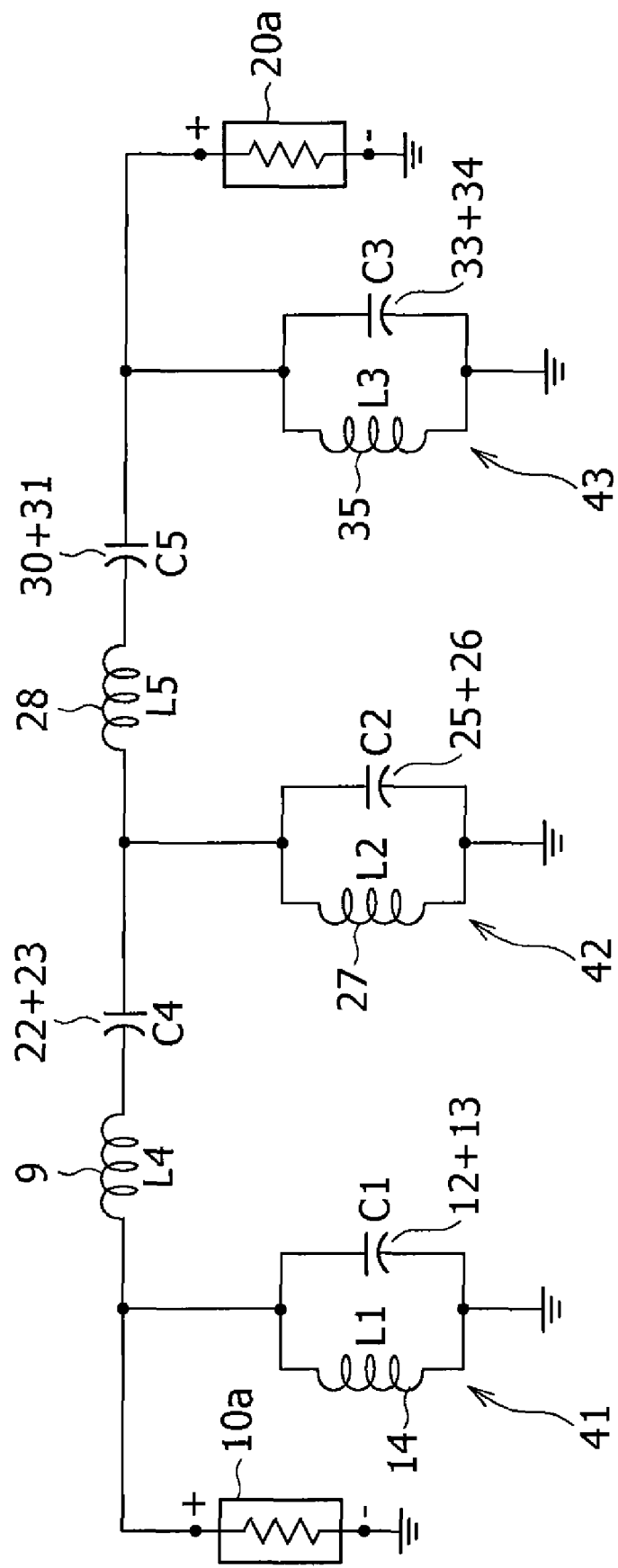
FIG. 2 is a circuit diagram of a main portion of the semiconductor device interconnecting unit shown in FIG. 1.

FIG. 2 is a circuit diagram of a main portion of the semiconductor device 10 and the external circuit 20 which are interconnected to each other by the semiconductor device interconnecting unit 8. Band pass portions which are built in the semiconductor device 10 and the external circuit 20, respectively, and the semiconductor device interconnecting unit 8 constitute the band pass filter. In particular, FIG. 2 shows a circuit diagram of a Chebyshev type band pass filter (type 1 and n=5). This Chebyshev type band pass filter has a pass band from 58 to 62 GHz.

The semiconductor device 10 includes a load 10a, and the LC resonance circuit 41 constituting a part of the band pass filter. The LC resonance circuit 41 includes the fixed inductor 14, and a capacitor 12+13 which is connected in parallel with the fixed inductor 14. The capacitor 12+13 includes the fixed capacitor 12 and the variable capacitor 13 connected in parallel with each other as shown in FIG. 1. Therefore, a capacitance value in the LC resonance circuit 41 is variable.

The semiconductor device 10 and the external circuit 20 are connected to each other through the bonding wire 9. An inductor (its inductance value is designated with L4) corresponding to the bonding wire 9 is shown in FIG. 2. In addition, the fixed capacitor 22 and the variable capacitor 23 are formed on the surface of the external circuit 20 between the bonding pad 21 and the connection portion 24 of the external circuit 20. In this case, the fixed capacitor 22 and the variable capacitor 23 are shown in the form of a capacitor 22+23 connected to the inductor (L4) of the bonding wire 9 in FIG. 2. Thus, a capacitance value of the capacitor 22+23 is also variable. Two LC resonance circuits 42 and 43 are provided on the external circuit 20 side. The LC resonance circuit 42 includes the fixed capacitor 25, the variable capacitor 26, and the fixed inductor 27 which are formed in a depth direction from the connection portion 24. In addition, the LC resonance circuit 43 includes the fixed capacitor 33, the variable capacitor 34, and the fixed inductor 35 which are formed in a depth direction from the connection portion 32. The external circuit 20 also includes a load portion 20a.

Figure 3A:
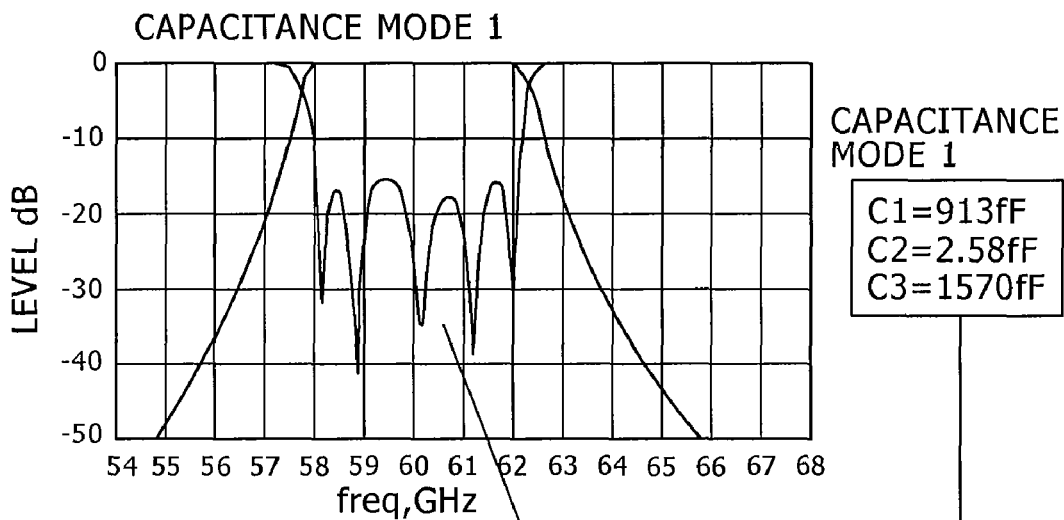
FIGS. 3A and 3B are respectively graphs explaining an example in which a pass band is changed to another one by changing capacitance values of variable capacitors.
Figure 3B:
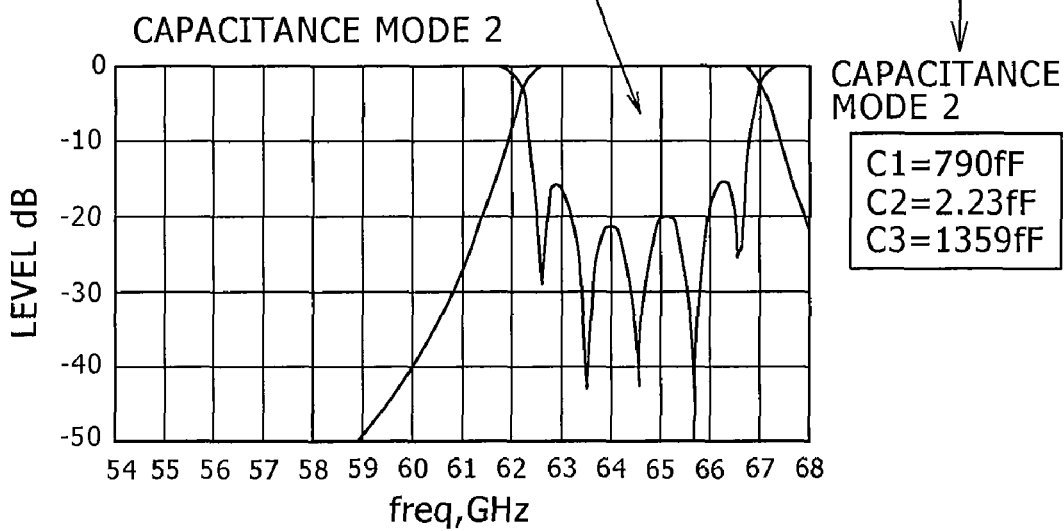

An operation of the semiconductor device interconnecting unit 8 shown in FIGS. 1 and 2 is described in detail hereinafter with reference to FIG. 3. Below, a description is given with respect to a switch function of shifting a pass band for the high-frequency signal to another one by changing the capacitance values of the variable capacitors 13, 23, 26, 31 and 34. A capacitance value C1 of the capacitor 12+13 of the LC resonance circuit 41 is set as 913 fF, a capacitance value C2 of the capacitor 25+26 of the LC resonance circuit 42 is set as 2.58 fF, and a capacitance value C3 of the capacitor 33+34 of the LC resonance circuit 43 is set as 1570 fF. When a capacitance mode at this time is set as a capacitance mode 1, as shown in FIG. 3A, the pass band for the high-frequency signal can be set in the range of 58 to 62 GHz based on the capacitance mode 1. In addition, the capacitance value C1 of the capacitor 12+13 of the LC resonance circuit 41 is set as 790 fF, the capacitance value C2 of the capacitor 25+26 of the LC resonance circuit 42 is 2.23 fF, and the capacitance value C3 of the capacitor 33+34 of the LC resonance circuit 43 is set as 1359 fF. When a capacitance mode at this time is set as a capacitance mode 2, as shown in FIG. 3B, the pass band for the high-frequency signal can be switched from the pass band of 58 to 62 GHz over to a pass band of 62 to 67 GHz in accordance with the capacitance mode 2.

As described above, according to the embodiment, it is possible to provide the high-frequency switch having the excellent isolation. In addition, controlling the variable capacitors 13, 23, 26, 31 and 34 makes it possible to compensate for the dispersion of the characteristics caused by the dispersion of the manufacturing processes, and the environmental change.

Note that, the semiconductor device interconnecting unit may adopt such a constitution that only fixed capacitors are used, and a high-frequency signal having a millimeter wave band is inputted/outputted to/from the semiconductor device instead of adopting the constitution that the variable capacitors are added to the fixed capacitors of the part and the remainder of the band pass filter, respectively, as described above. Hereinafter, this constitution is described in other embodiments. Note that, in the other embodiments, all fixed capacitors are simply referred to as capacitors.

Figure 4:
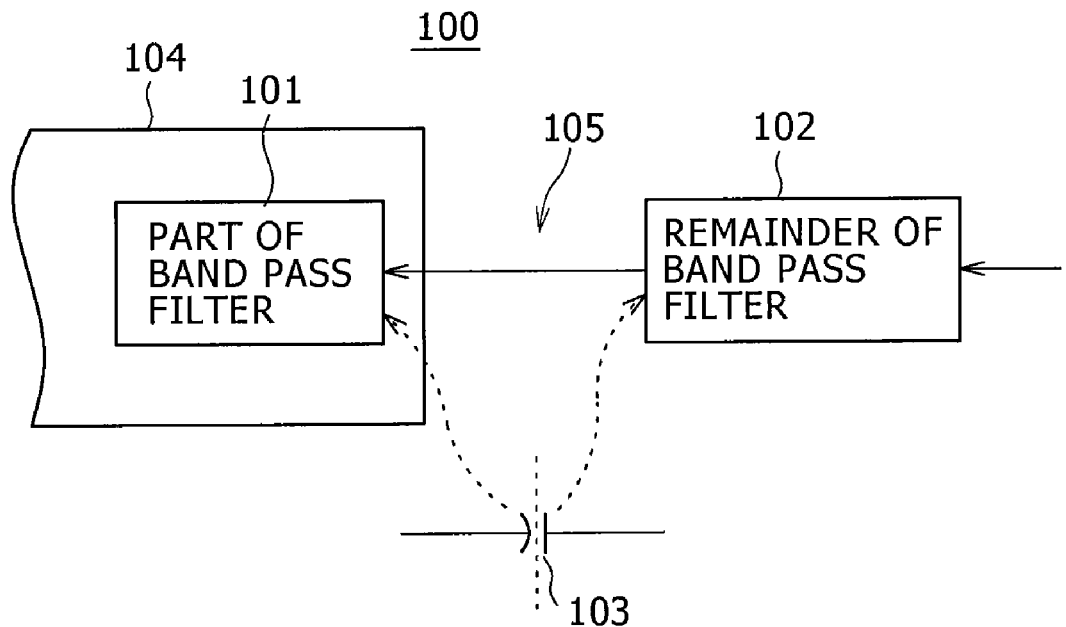
FIG. 4 is a block diagram of a semiconductor device interconnecting unit according to another embodiment.

FIG. 4 is a block diagram showing a schematic constitution of a semiconductor device interconnecting unit 100 according to another embodiment. The semiconductor device interconnecting unit 100 includes a part 101 of a band pass filter for passing therethrough a high-frequency signal having a millimeter wave band by using an LC resonance circuit, and a remainder 102 of the band pass filter. Here, the part 101 of the band pass filter, and the remainder 102 thereof are separated from each other by a capacitive portion 103. The part 101 of the band pass filter is provided inside a semiconductor device 104, and the remainder 102 thereof is provided in an outside 105 of the semiconductor device 104.

In other words, the semiconductor device 104 is one for receiving as its input/outputting a high-frequency signal having a millimeter wave band, and includes the part 101 of the band pass filter for passing therethrough the high-frequency signal having a millimeter wave band by an LC resonance circuit. Also, the part 101 of the band pass filter is connected to the remainder 102 of the band pass filter provided in the outside 105 by the capacitive portion 103.

In particular, in this embodiment, a circuit is separated into two parts by the portion 103 having a small capacity in the band pass filter 101+102 having the part 101 and the remainder 102. Thus, the part 101 of the circuit structure of the band pass filter is provided inside the semiconductor device 104, and the remainder 102 of the band pass filter which is not included within the semiconductor device 104 is included in an adaptor for signal connection. Also, the adaptor for signal connection and the semiconductor device 104 are interconnected to each other by the portion 103 having the small capacity in the band pass filter. As a result, the satisfactory signal connection is realized by the small semiconductor connection portion.

Figure 5:
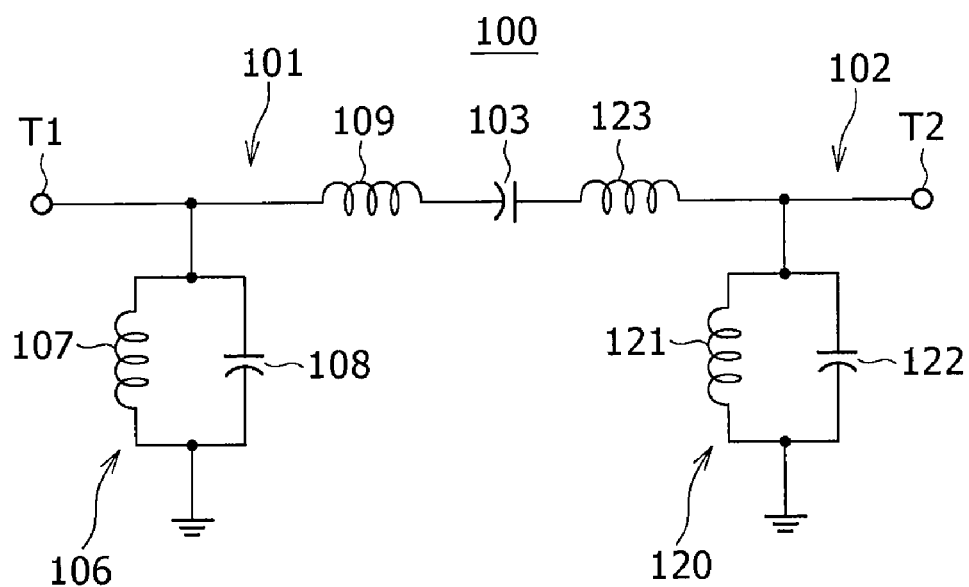
FIG. 5 is a circuit diagram of a main portion of the semiconductor device interconnecting unit shown in FIG. 4.

FIG. 5 is a circuit diagram of a main portion of the semiconductor device interconnecting unit 100 shown in FIG. 4. The part 101 of the band pass filter structure is interconnected to the remainder 102 of the band pass structure through the capacitor 103. An inductor 109 and an inductor 123 are connected to each other so as to hold the capacitor 103 between them. An LC resonance circuit 106 is provided between the inductor 109 and an input/output terminal T1. The LC resonance circuit 106 has an inductor 107 and a capacitor 108 connected in parallel with each other. In addition, an LC resonance circuit 120 is provided between the inductor 123 and an input/output terminal T2. The LC resonance circuit 120 has an inductor 121 and a capacitor 122 connected in parallel with each other.

For example, a semiconductor device which manages a high-frequency signal having a millimeter wave band, for example, containing 60 GHz does not necessarily pass therethrough a D.C. component of the high-frequency signal having a millimeter wave band. Thus, there is adopted a constitution that the band pass filter passes therethrough only a signal component having a frequency band necessary for transmission of a signal having a millimeter wave band, and a signal is transmitted between the semiconductor device and the outside. In this case, the band pass filter is separated into the two parts by the portion having the small capacity of the band pass filter, for example, the capacitor 103. Also, the semiconductor device 104 and the outside 105 are connected to each other by the part 101 and the remainder 102 of the band pass filter separated from each other. With the constitution as described above, the high-frequency signal having a millimeter wave band is inputted/outputted to/from the semiconductor device 104, which results in an unnecessary signal having a band out of a given band that can be cut off.

Figure 6:
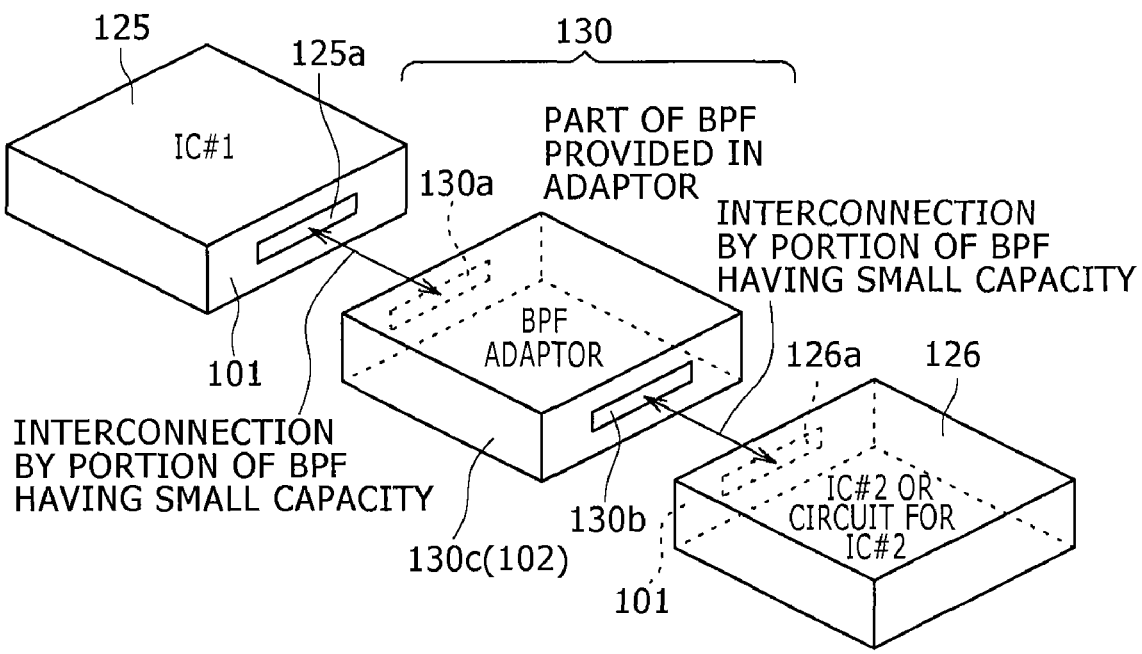
FIG. 6 is a schematic perspective view of a semiconductor device interconnecting unit for interconnecting two semiconductor devices according to another embodiment.

FIG. 6 is a schematic perspective view of a semiconductor device interconnecting unit 130 for interconnecting first and second semiconductor devices 125 and 126 to each other according to still another embodiment. The semiconductor device interconnecting unit 130 includes first and third parts 101 and 101 of a band pass filter included in the first and second semiconductor devices 125 and 126, respectively, and a remainder 102 of the band pass filter included in an adaptor 130c for signal connection.

The first semiconductor device 125 and the adaptor 130c for signal connection are connected to each other by the first part 101 and the remainder 102 of the band pass filter similar to those shown in FIG. 4. In addition, the adaptor 130c for signal connection and the second semiconductor device 126 are connected to each other by the third part 101 and the remainder 102 of the band pass filter similar to those shown in FIG. 4.

More specifically, the semiconductor device interconnecting unit 130 is one for interconnecting at least the two semiconductor devices 125 and 126 to/from each of which the high-frequency signal having the millimeter wave band is inputted/outputted. Also, the semiconductor device interconnecting unit 130 includes the first part 101 of the band pass filter, the second part 102 of the band pass filter included in the adaptor 130c for signal connection, and the third part 101 of the band pass filter. Here, the first part 101 of the band pass filter passes therethrough the high-frequency signal having the millimeter wave band by an LC resonance circuit.

Also, the adjacent first and second parts 101 and 102, the adjacent second and third parts 102 and 101 are separated from each other by capacitive portions (capacitors), respectively. The first part 101 is provided inside the first semiconductor device 125, and the third part 101 is provided inside the second semiconductor device 126. Also, the second part 102 is included in the adaptor 130c for signal connection having input/output terminals 130a and 130b which face an input/output terminal 125a of the first part 101, and an input/output terminal 126a of the third part 101, respectively. Also, the second part 102 is provided outside each of the first and second semiconductor devices 125 and 126.

Figure 7:
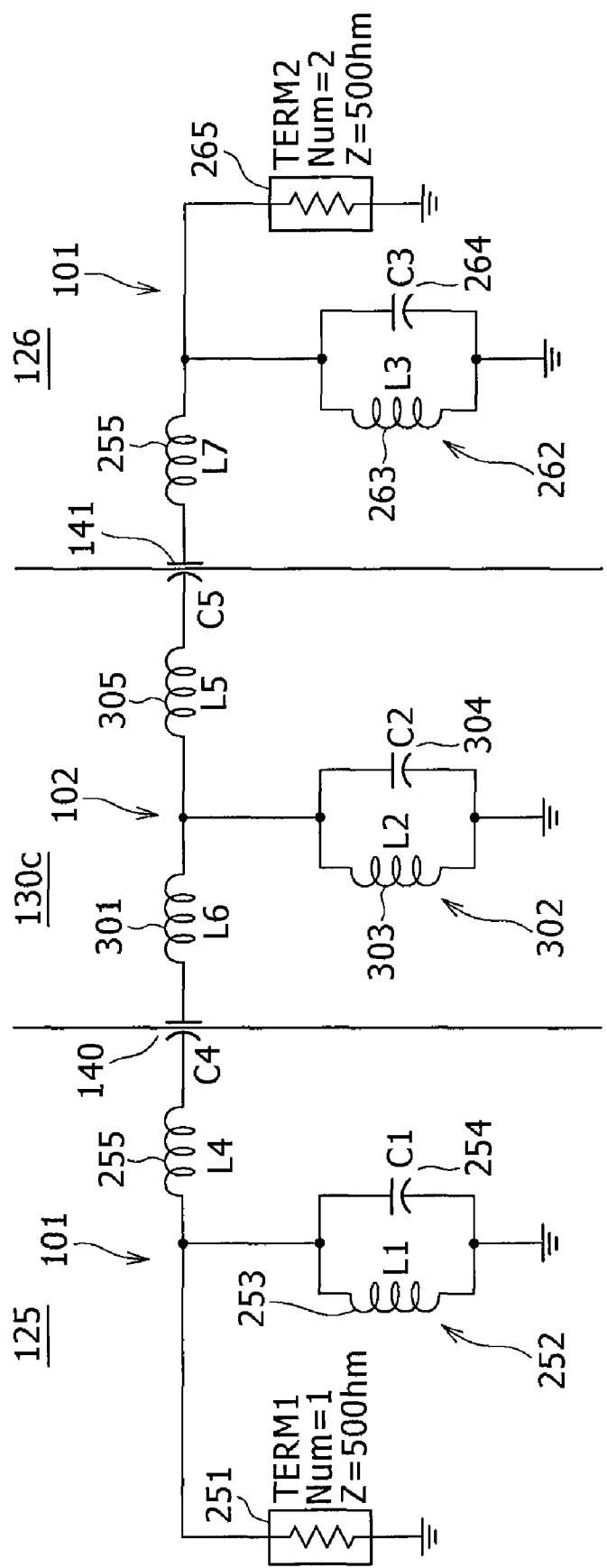
FIG. 7 is a circuit diagram of the semiconductor device interconnecting unit for interconnecting the two semiconductor devices shown in FIG. 6.

FIG. 7 is a circuit diagram of the first and second semiconductor devices 125 and 126 interconnected to each other by the adaptor 130c for signal connection, and the adaptor 130c for signal connection. Here, the first and second semiconductor devices 125 and 126 and the adaptor 130c for signal connection constitute the semiconductor device interconnecting unit 130 shown in FIG. 6. The first and third built-in band pass portions 101 and 101 of the first and second semiconductor devices 125 and 126, and the adaptor 130c for signal connection constitute a band pass filter. In particular, FIG. 7 shows a circuit diagram of a Chebyshev type band pass filter (type 1 and n=1). This Chebyshev type band pass filter has a pass band from 58 GHz to 62 GHz.

In the first semiconductor device 125, a load 251 and an LC resonance circuit 252 which are connected in parallel with each other are connected in series with an inductor 255. The LC resonance circuit 252 includes an inductor 253 and a capacitor 254 connected in parallel with the inductor 253.

In the second semiconductor device 126, a load 265 and a resonance circuit 262 which are connected in parallel with each other are connected in series with an inductor 261. The resonance circuit 262 includes an inductor 263 and a capacitor 264 connected in parallel with the inductor 263.

The adaptor 130c for signal connection includes an LC resonance circuit 302 provided between an intermediate node between the inductors 301 and 305, and the earth. The resonance circuit 302 includes an inductor 303 and a capacitor 304 connected in parallel with each other.

The semiconductor device which manages the high-frequency signal having a millimeter wave band, for example, from 58 GHz to 62 GHz does not necessarily pass therethrough a D.C. component. Thus, there is adopted a constitution that the band pass filter passes therethrough only a signal component having a frequency band necessary for transmission of a signal having a millimeter wave band, and a signal is transmitted between the semiconductor device and the outside. In this case, the band pass filter is separated into the three parts by the portions each having a small capacity, for example, the capacitors 140 and 141, and the first and second semiconductor devices 125 and 126 are connected to each other by the two parts 101 of the band pass filter thus separated, and the remainder 102 of the band pass filter. With the constitution as described above, the high-frequency signal is inputted/outputted to/from each of the semiconductor devices 125 and 126, which results in that the unnecessary signal having a band out of a given band can be cut off.

In FIG. 7, an inductance value and a capacitance value of the inductor 253 and the capacitor 254 of the resonance circuit 252 on the first semiconductor device 125 side are designated with L1 and C1, respectively, and an inductance value of the inductor 255 on the first semiconductor device 125 side is designated as L4. In addition, inductance values of the inductor 301 the inductor 305 in the adaptor 130c for signal connection are designated with L6 and L5, respectively, and an inductance value and a capacitance value of the inductor 303 and the capacitor 304 of the resonance circuit 302 in the adaptor 130c for signal connection are designated with L2 and C2, respectively. Also, an inductance value of the inductor 261 on the second semiconductor device 126 side is designated with L7, and an inductance value and a capacitance value of the inductor 263 and the capacitor 264 of the resonance circuit 262 on the second semiconductor device 126 side are designated with L3 and C3, respectively. Moreover, capacitance values of the capacitors 140 and 141 are designated with C4 and C5, respectively.

Figure 8:
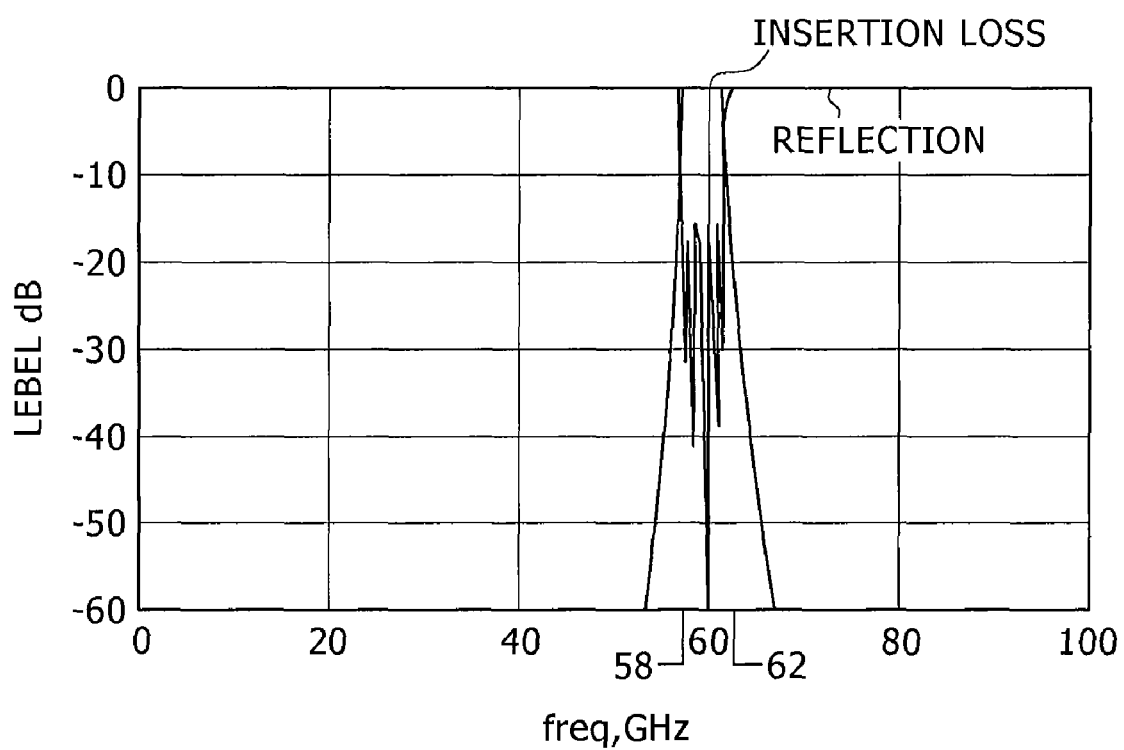
FIG. 8 is a graph showing interconnection characteristics of the semiconductor device interconnecting unit for interconnecting the two semiconductor devices shown in FIG. 6.

FIG. 8 is a graph showing interconnection characteristics obtained when the first and second semiconductor devices 125 and 126 are interconnected to each other by using the circuit shown in FIG. 7. In the figure, an axis of ordinate represents a signal level (dB), and an axis of abscissa represents a frequency (GHz). Although an insertion loss and reflection are recognized in the graph shown in FIG. 8, when L1=7.71 pH, L2=4.48 pH, L3=7.71 pH, C1=913 fF, C2=1570 fF, and C3=913 fF, and also L4=273 pH, C4=2.25 fF, L5=L6=2457 fF, C5=2.58 fF and L7=273 oH in the circuit shown in FIG. 7, it is possible to realize the pass band from 58 GHz to 62 GHz.

Figure 9:
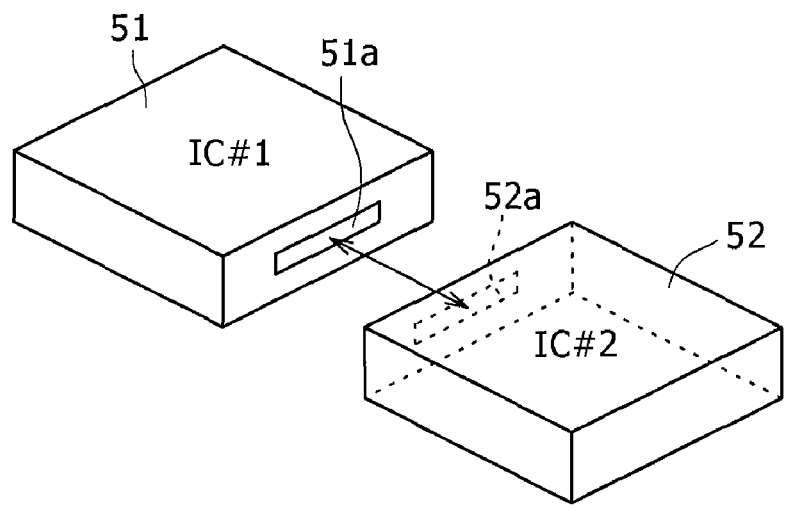
FIG. 9 is a schematic perspective view showing a constitution of a comparative example as a related art.
Figure 10:
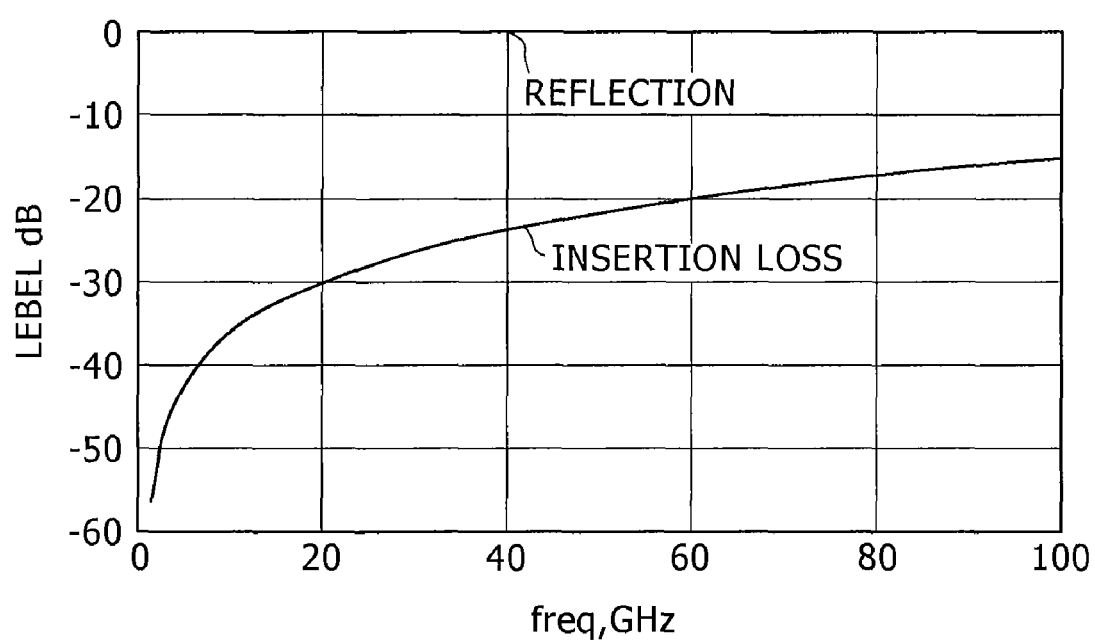
FIG. 10 is a graph showing capacitive interconnection characteristics of the comparative example in the related art shown in FIG. 9.

FIG. 9 shows a comparative example in which a first semiconductor device 51 and a second semiconductor device 52 are simply interconnected to each other through interchip-interconnection by using a capacitor having the same capacity as that of each of the capacitors 103, and 140 and 141. FIG. 10 shows a capacitive interconnection characteristics diagram of the comparative example shown in FIG. 9. As can be seen from FIG. 10, it is confirmed that although the insertion loss and the reflection are recognized, the interconnection is hardly carried out when the first and second semiconductor devices (chips) 51 and 52 are simply interconnected through the interchip-interconnection by using the same capacity.

Figure 11:
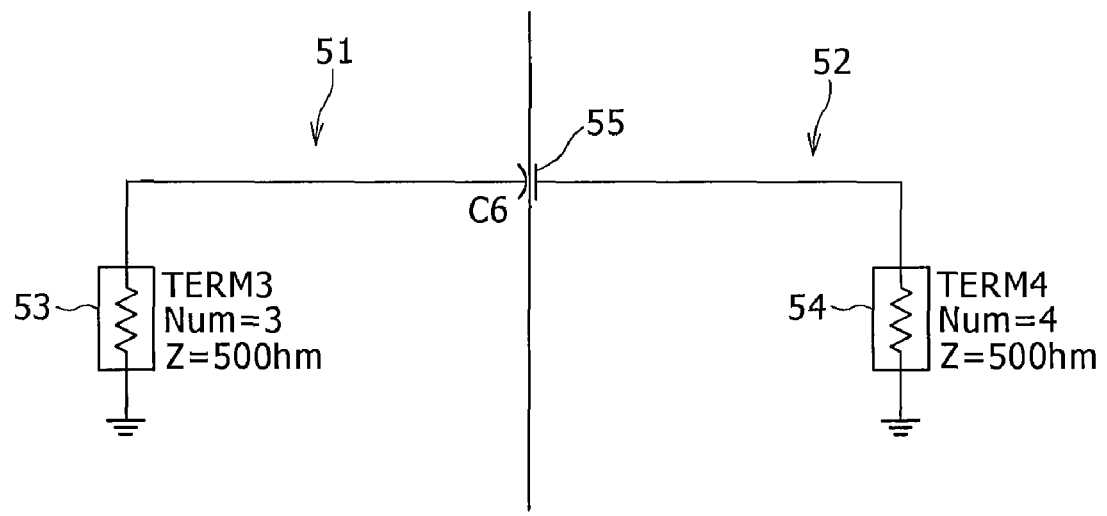
FIG. 11 is a circuit diagram of the comparative example having capacitive interconnection in the related art shown in FIG. 9.

FIG. 11 shows a circuit diagram when the interchip-interconnection is simply carried out by using the same capacity. The first semiconductor device 51 having a load 53, and the second semiconductor device 52 having a load 54 are simply interconnected to each other through the interchip-interconnection by a capacitor 55.

A large capacity is necessary for the capacitive interconnection in such a comparative example. As has been described, when the interchip-interconnection is simply carried out by using the same capacity, the interconnection is hardly obtained.

Next, a description is given with respect to an example in which the semiconductor device interconnecting unit according to the other embodiment shown in FIG. 4 is applied to a receiver. That is to say, in this example, the semiconductor device interconnecting device according to the embodiment shown in FIG. 4 is applied to a high-frequency module in which a semiconductor device to/from which a high-frequency signal having a millimeter wave band is inputted/outputted is installed. In this case, the semiconductor device includes a part of a band pass filter for passing therethrough the high-frequency signal having the millimeter wave band by using an LC resonance circuit. Also, the part of the band pass filter is interconnected to a remainder of the band pass filter provided outside the semiconductor device by a capacitive portion.

Figure 12:
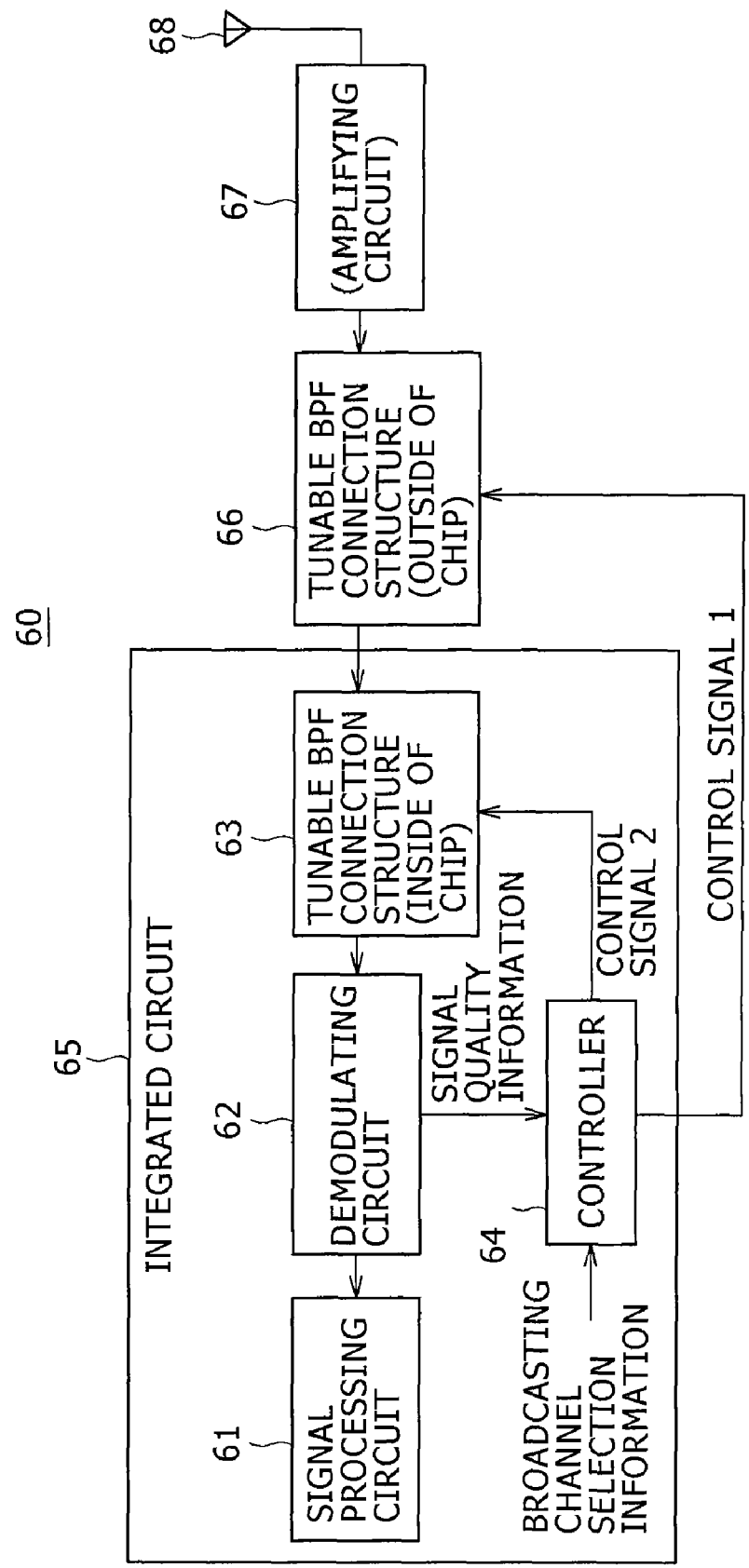
FIG. 12 is a block diagram of an example in which tunable BPF connection is applied to a receiver.

FIG. 12 shows an example in which a tunable BPF connection structure is used in a receiver. After a signal is received at an antenna 68 and is amplified by an amplifying circuit 67, the resulting signal is supplied to a tunable BPF connection structure portion (provided outside a chip) 66.

The tunable BPF connection structure portion (outside of chip) 66 is provided outside an integrated circuit 65 because it is one of two parts into which a BPF for passing therethrough a high-frequency signal having a desired frequency is separated by a capacitive portion used to form an LC resonance structure.

A tunable BPF connection structure portion (provided inside the chip) 63 is the remainder obtained through the separation by the capacitive portion for formation of the above-mentioned resonance structure, and is provided inside the semiconductor chip 65.

The high-frequency signal having the desired frequency which is obtained through the filtering for the band pass in the BPF is outputted through an output terminal of the tunable BPF connection structure portion (inside of chip) 63. This high-frequency signal is supplied to a demodulating circuit 62.

The demodulating circuit 62 subjects the high-frequency signal having the desired frequency to demodulation processing corresponding to modulation processing on a transmitter side, and supplies the resulting high-frequency signal to a signal processing circuit 61 in a subsequent stage of the demodulating circuit 62. In addition, the demodulating circuit 62 generates signal quality information, and supplies the signal quality information to a controller 64.

The controller 64 generates tuner channel selection control signals 1 and 2 in accordance with channel selection information generated in accordance with an operation or the like for the receiver made by a user. Also, the controller 64 supplies the tuner channel selection control signals 1 and 2 to the tunable BPF connection structure portion (outside of chip) 66 and the tunable BPF connection structure portion (inside of chip) 63, respectively.

When being built in the semiconductor chip, the BPF structure uses a large area within the semiconductor chip. This is a problem. In addition, it is difficult to form a structure having a high Q on a silicon substrate. This is another problem. At a high frequency, for example, contained in a millimeter wave band, a signal is reflected by a capacitive component of a pad for an input/output terminal, an inductive component of a bonding, or the like. On the other hand, a BPF often uses a resonance structure. This resonance structure is skillfully utilized, and the capacitive component or the like of the pad is utilized as one of constituent components of the BPF, thereby enabling a millimeter wave band pass type connection to be realized.

In order to utilize the capacity or the like of the pad for the BPF, it is necessary to increase a precision of the capacitive value thereof. Actually, the capacitive value disperses due to the dispersion caused in the phase of the manufacture. In order to solve this problem, for example, the signal quality information is read out from the circuit, such as the demodulating circuit 62 shown in FIG. 12, which can tell the quality of the signal from the BPF connection structure. Also, the controller 64 generates the tuner channel selection control signals 1 and 2 in accordance with the signal quality information thus read out, and sends the tuner channel selection control signals 2 and 1 to the BPF connection structure 63 provided inside the integrated circuit 65, and the BPF connection structure 66 provided outside the integrated circuit 65, respectively. As a result, the signal can be optimized and the dispersion caused by the manufacturing process, the temperature change or the like can be corrected. Here, the connection made at a much lower frequency than that in the tunable BPF connection structure is sufficient for the connection of the tuner channel selection control signals 1 and 2.

Figure 13:
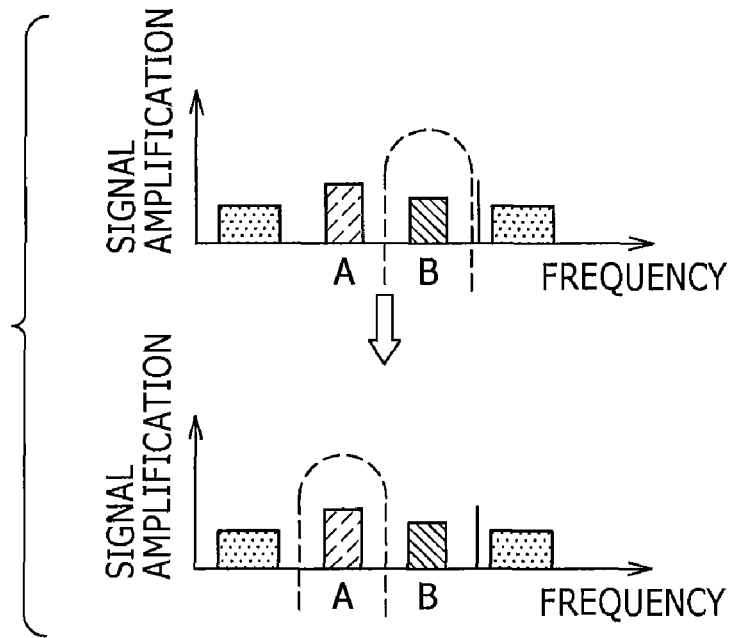
FIG. 13 is a graphical representation explaining an example in which a band pass structure used in the embodiment is utilized for an operation for selecting a channel.

In addition, channel selection information is sent to the controller 64, which results in that as shown in FIG. 13. It is also possible to change the channel frequency from a channel frequency B over to a channel frequency A for the channel selection.

Figure 14:
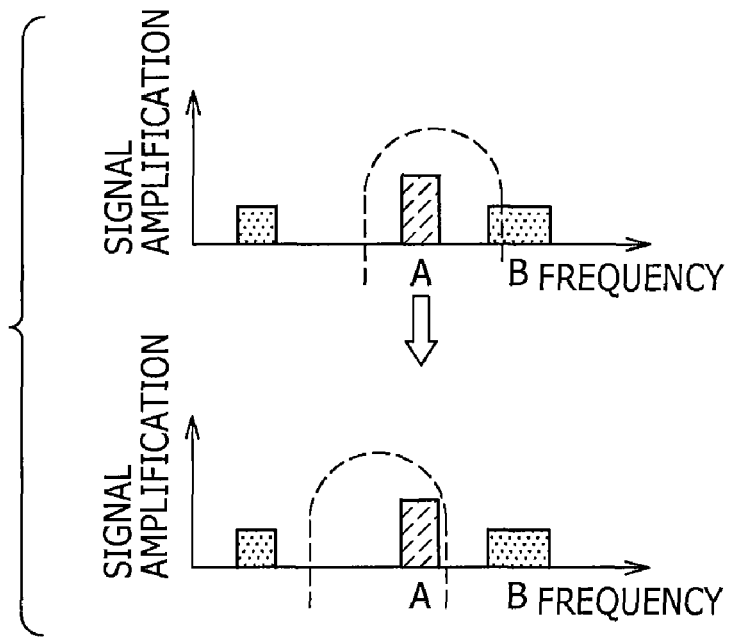
FIG. 14 is a graphical representation explaining an example in which the band pass structure used in the embodiment is utilized for removal of an interfering wave.

In addition, the embodiment can also be utilized for such an application that a central frequency of the filter is shifted in order to suppress an influence of an interfering wave as shown in FIG. 14.

It is also a large merit that the using of the band pass type connection as the connection between the semiconductor chip and the outside makes it possible to suppress the interfering noises from other frequencies.

Figure 15:
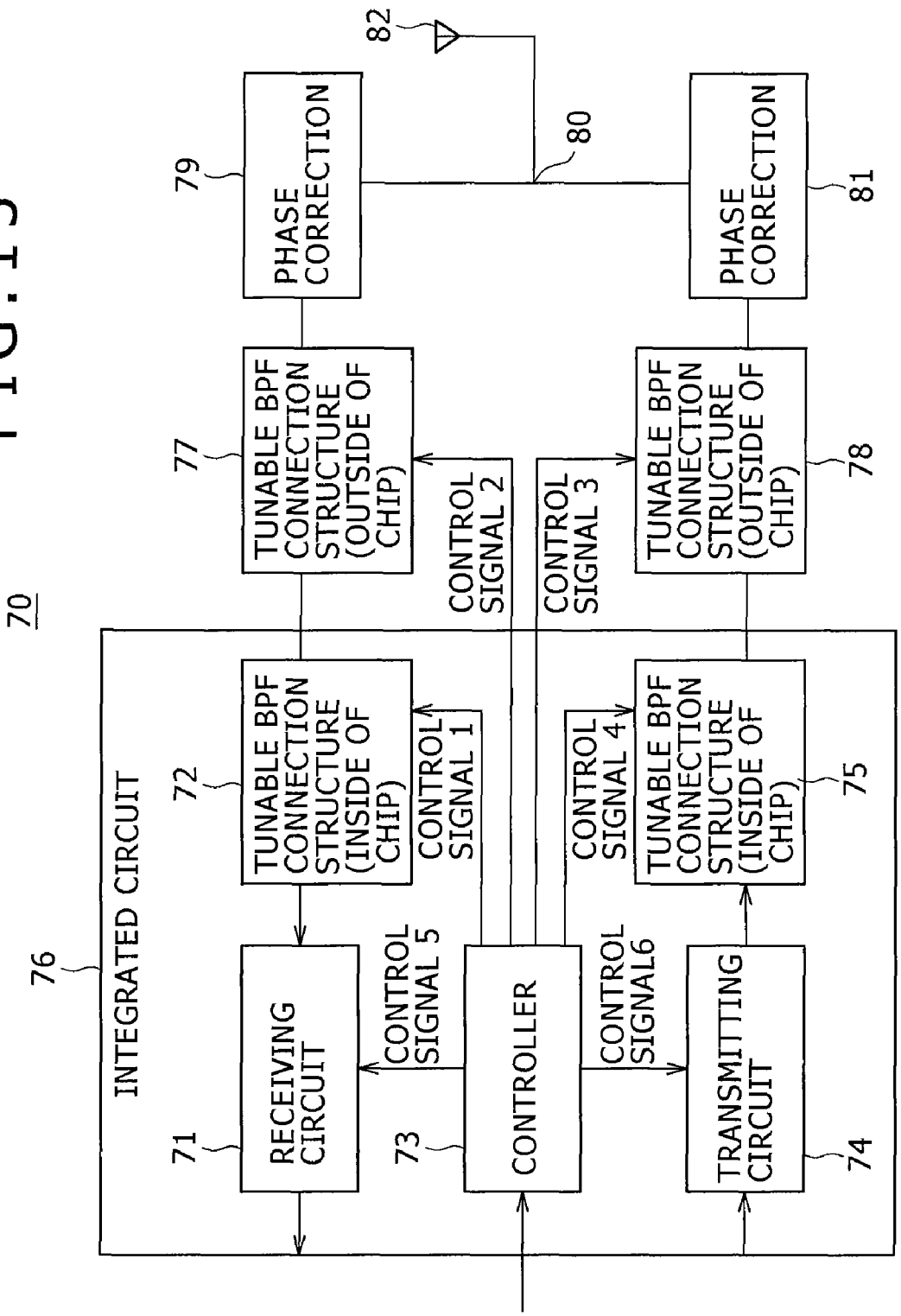
FIG. 15 is a block diagram of a constitution of an example in which a combination of two interconnection structures is used in the form of a switch for transmission/reception.

Next, a description is given with respect to another example in which the semiconductor device interconnecting unit according to the other embodiment shown in FIG. 4 is used in switching of a transmitter-receiver. FIG. 15 is a block diagram showing a constitution in which a combination of the two connection structures is used in the form of a switch for transmission/reception.

A reception side of the transmitter-receiver receives a signal at an antenna 82, and supplies the signal to a phase correcting portion 79 through a branch point 80. After correcting a phase of the received signal, the phase correcting portion 79 supplies the resulting signal to a tunable BPF connection structure portion (provided outside a chip) 77. The tunable BPF connection structure portion (outside of chip) 77 is provided outside an integrated circuit 76 because it is one of two parts into which a BPF for passing therethrough a high frequency signal having a desired frequency is separated by a capacitive portion for formation of a resonance structure.

The remainder of the two parts into which the BPF is separated by the capacitive portion for formation of the resonance structure, that is, a tunable BPF connection structure portion (provided inside the chip) 72 is provided inside the integrated circuit 76.

A high-frequency signal having a desired frequency which is obtained through the filtering for the band pass in the BPF is outputted through an output terminal of the tunable BPF connection structure portion (inside of chip) 72. The high-frequency signal having a desired frequency is supplied to a receiving circuit 71.

On the other hand, a transmission side of the transmitter-receiver includes a transmitting circuit 74, a tunable BPF connection structure portion (provided inside the chip) 75, a tunable BPF connection structure portion (provided outside the chip) 78, and a phase correcting portion 81. Here, the transmitting circuit 74 processes an input signal into one for transmission. The tunable BPF connection structure portion (inside of chip) 75 is one of two parts into which a BPF for passing therethrough a high frequency signal having a desired frequency is separated by a capacitive portion, and receives as its input the transmission signal obtained through the transmission processing in the transmitting circuit 74. The tunable BPF connection structure portion (outside of chip) 78 constitutes together with the tunable BPF connection structure portion (inside of chip) 75 the BPF. Also, the phase correcting portion 81 corrects a phase of the high-frequency signal which is obtained through the filtering for the band pass in the tunable BPF connection structure portion (outside of chip) 78.

The receiving circuit 71 on the reception side and the transmitting circuit 74 on the transmission side are connected to each other through the controller 73. In addition, the controller 73 is connected to each of the tunable BPF connection structure portion (inside of chip) 72 and the tunable BPF connection structure portion (outside of chip) 77 on the reception side. Also, the controller 73 supplies control signals 1 and 2 to the tunable BPF connection structure portion 72 and the tunable BPF connection structure portion 77, respectively. Also, the controller 73 is also connected to each of the tunable BPF connection structure portion (inside of chip) 75 and the tunable BPF connection structure portion (outside of chip) 78 on the transmission side, and supplies control signals 4 and 3 to the tunable BPF connection structure portion 75 and the tunable BPF connection structure portion 78, respectively.

When an incoming signal is received, the controller 73 performs the control by using the control signals 1 to 4 so that each of the tunable BPF connection structure portion 72 and the tunable BPF connection structure portion 77 has the pass band, while each of the tunable BPF connection structure portion 75 and the tunable BPF connection structure portion 78 has a non-pass band. The incoming signal is reflected by the tunable BPF connection structure portion 75 and the tunable BPF connection structure portion 78 each having the non-pass band, and the phase correcting portions 79 and 81 are designed so that an impedance when the tunable BPF connection structure portion 75 side is viewed from the branch point 80 becomes infinite. As a result, the satisfactory switch free from the loss can be realized in the millimeter wave band. On the other hand, when a transmission signal is transmitted, the controller 73 performs the control by using the control signals 1 to 4 so that each of the tunable BPF connection structure portion 72 and the tunable BPF connection structure portion 77 has the non-pass band, while each of the tunable BPF connection structure portion 75 and the tunable BPF connection structure portion 78 has the pass band, thereby causing the transmission signal to flow to the antenna 82. As a result, the isolation between the receiving circuit 71 and the transmitting circuit 74 is realized.

It is not easy to realize a satisfactory switch in the millimeter wave band on the silicon substrate. Thus, satisfactory switch is realized in the millimeter wave band by utilizing the input/output structure necessary for connection to the semiconductor chip. Since the operation of the switch is not mechanically performed, but is performed depending only on the electrical control, a high-speed switch can be realized.

In addition, a combination of this switch for transmission/reception with the control structure makes it possible to correct the dispersion or the like as well of the semiconductors and the manufacturing processes.

Figure 16:
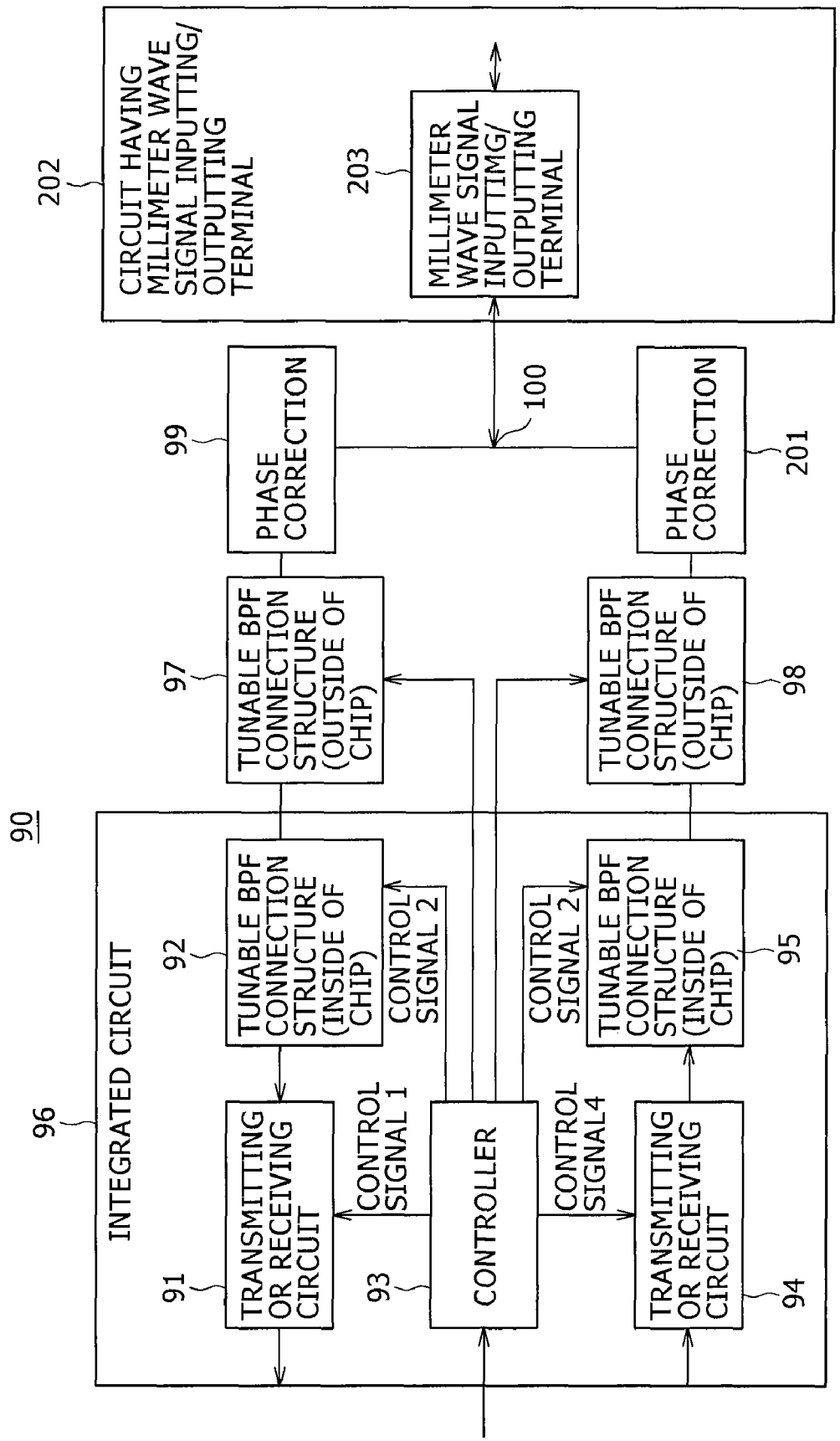
FIG. 16 is a block diagram of a constitution of an example in which the semiconductor device interconnecting unit of the embodiment is utilized for connection between two circuits.
Figure 17:
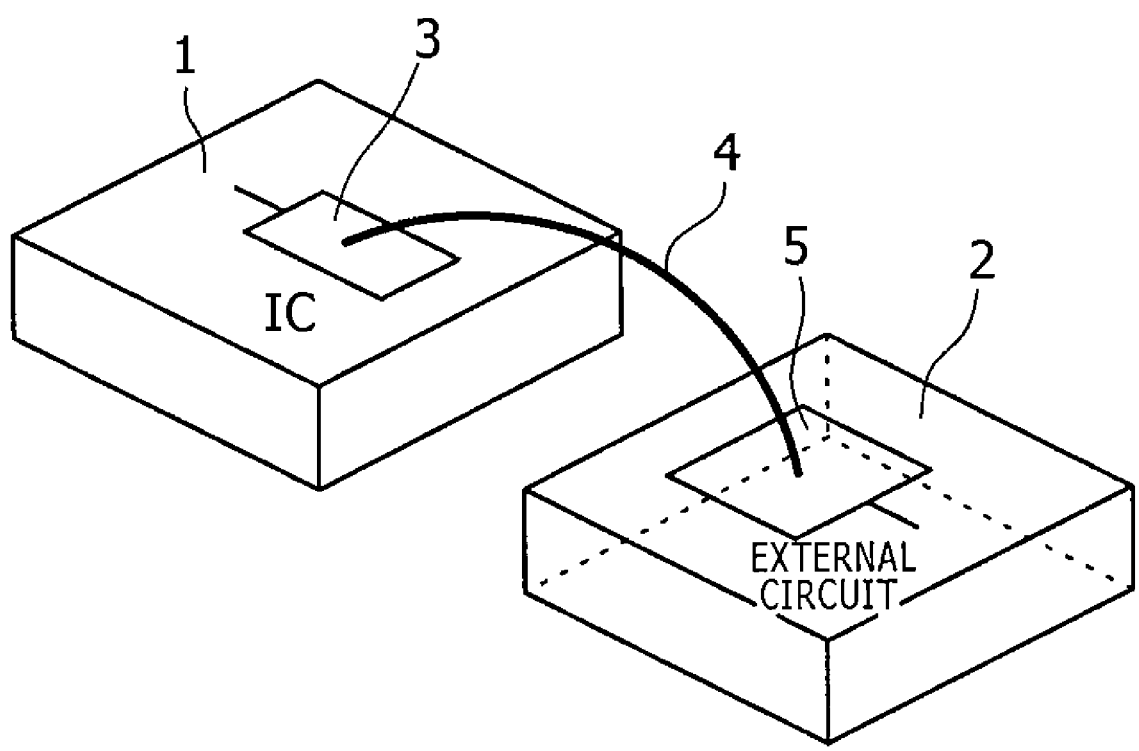
FIG. 17 is a perspective view showing an example in which a semiconductor device and an external circuit are interconnected to each other in another related art.

Next, a description is given with respect to another example in which the semiconductor device interconnecting unit according to the embodiment is utilized for connection between circuits. As shown in FIG. 16, a high-frequency module 90 is described in this example. In the high-frequency module 90, a high-frequency signal having a millimeter wave band is transmitted between an integrated circuit 96 including transmitting or receiving circuits 91 and 94 of two systems, and a circuit 202 having a terminal 203 through which a millimeter wave signal is inputted/outputted. That is to say, this example is such that a switch, for transmission/reception, having a combination of two connection structures is utilized for connection between the two circuits 96 and 202.

The integrated circuit 96 includes a first system having a transmitting or receiving circuit 91, and a tunable BPF connection structure portion (provided inside a chip) 92, a second system having a transmitting or receiving circuit 94, and a tunable BPF connection structure portion (provided inside a chip) 95, and a controller 93. Here, the tunable BPF connection structure portion (inside of chip) 92 is one of two parts into which a BPF for passing therethrough a high-frequency signal having a desired frequency is separated by a capacitive portion for formation of a resonance structure. Also, the tunable BPF connection structure portion (inside of chip) 95 is one of two parts into which a BPF for passing therethrough a high-frequency signal having a desired frequency is separated by a capacitive portion for formation of a resonance structure similarly to the tunable BPF connection structure portion (inside of chip) 92. The controller 93 is connected to each of the tunable BPF connection structure portion (inside of chip) 92, and a tunable BPF connection structure portion (provided outside the chip) 97, and supplies control signals 1 and 2 to the tunable BPF connection structure portion 92 and the tunable BPF connection structure portion 97, respectively. Also, the controller 93 is connected to each of the tunable BPF connection structure portion (inside of chip) 95 and a tunable BPF connection structure portion (provided outside the chip) 98, and supplies control signals 4 and 3 to the tunable BPF connection structure portion 95 and the tunable BPF connection structure portion 98, respectively.

The tunable BPF connection structure portion (outside of the chip) 97, and the tunable BPF connection structure portion (outside of chip) 98 are provided outside the integrated circuit 96. Here, the tunable BPF connection structure portion (outside of the chip) 97 is connected to the tunable BPF connection structure portion (inside of chip) 92 provided inside the integrated circuit 96. Also, the tunable BPF connection structure portion (outside of the chip) 98 is connected to the tunable BPF connection structure portion (inside of chip) 95. In addition, the high-frequency module 90 also includes a phase correcting portion 99, and a phase correcting portion 201. Here, the phase correcting portion 99 corrects a phase of the high-frequency signal which is obtained through the filtering for the band pass in the tunable BPF connection structure portion (outside of the chip) 97. Also, the phase correcting portion 201 corrects a phase of the high-frequency signal which is obtained through the filtering for the band pass in the tunable BPF connection structure portion (outside of the chip) 98.

In the circuit 202 having the millimeter wave signal inputting/outputting terminal 203, the millimeter wave signal inputting/outputting terminal 203 is connected to each of the phase correcting portion 99 and the phase correcting portion 201.

The tunable BPF connection structure can also be used in the millimeter wave signal inputting/outputting terminal 203. Although in this example, only the two connection structures are provided on the semiconductor integrated circuit 96 side, the number of connection structures can be increased.

As set forth hereinabove, according to the embodiments, the information which is obtained through the frequency multiplexing operation can be readily demultiplexed. In addition, the switching at the high-frequency can be performed with the excellent isolation. In addition, the frequency multiplexing of the information makes it possible to use the input/output terminal in common. As a result, the number of input/output terminals can be reduced. Also, the use of the input/output portion for which the frequency band is limited makes it possible to control the necessary values of the capacity and the inductance of the shape of the input/output portion in the BPF portion. Also, performing the limitation in frequency band makes it possible to optimize the performance as well in terms of the switch. Moreover, using the variable capacitors makes it possible to compensate for the dispersion caused by the dispersion of the manufacturing processes, and the environmental change.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is as follows:

1. A semiconductor device interconnecting unit configured to input/output a high-frequency signal having a millimeter wave band to/from a semiconductor device, said semiconductor device interconnecting unit comprising:

a part of a band pass filter configured to pass therethrough the high-frequency signal having a millimeter wave band by using a first LC resonance circuit including a first fixed capacitor, a first variable capacitor, and a first fixed inductor; and a remainder of said band pass filter, said remainder including a second LC resonance circuit including a second fixed capacitor, a second variable capacitor, and a second fixed inductor;

wherein said part and said remainder are separated from each other, said part is provided inside said semiconductor device, and said remainder is provided outside said semiconductor device, and the part and the remainder are connected through a bonding wire connected to a first bond pad formed on a surface of the part, and to a second bond pad formed on a surface of the remainder, and wherein a pass band for the high-frequency signal having a millimeter wave band is changed by changing capacitance values of said variable capacitors.

2. A semiconductor device with a high-frequency signal having a millimeter wave band being inputted/outputted to/from said semiconductor device, said semiconductor device comprising:

a part of a band pass filter configured to pass therethrough the high-frequency signal having a millimeter wave band by using a first LC resonance circuit including a first fixed capacitor, a first variable capacitor, and a first fixed inductor;

wherein said part of said band pass filter is connected to a remainder of said band pass filter provided outside said semiconductor device, said remainder including a second LC resonance circuit including a second fixed capacitor, a second variable capacitor, and a second fixed inductor, wherein the part and the remainder are connected through a bonding wire connected to a first bond pad formed on a surface of the part, and to a second bond pad formed on a surface of the remainder, and wherein a pass band for the high-frequency signal is changed by changing capacitance values of said variable capacitors.

3. A high-frequency module with a semiconductor device to/from which a high-frequency signal having a millimeter wave band is inputted/outputted being installed together with other elements or devices in said high-frequency module, wherein said semiconductor device comprises a part of a band pass filter for passing therethrough the high-frequency signal having a millimeter wave band by using a first LC resonance circuit including a first fixed capacitor, a first variable capacitor, and a first fixed inductor;

a part of said band pass filter is connected to a remainder of said band pass filter provided outside said semiconductor device, said remainder including a second LC resonance circuit including a second fixed capacitor, a second variable capacitor, and a second fixed inductor; and wherein the part and the remainder are connected through a bonding wire connected to a first bond pad formed on a surface of the part, and to a second bond pad formed on a surface of the remainder, and wherein a pass band for the high-frequency signal is changed by changing capacitance values of said variable capacitors.

* * * * *